(12) United States Patent
Reijnders et al.

(10) Patent No.: US 11,971,663 B2
(45) Date of Patent: Apr. 30, 2024

(54) LIGHT SOURCES AND METHODS OF CONTROLLING; DEVICES AND METHODS FOR USE IN MEASUREMENT APPLICATIONS

(71) Applicant: ASML Netherlands B.V., Veldhoven (NL)

(72) Inventors: Marinus Petrus Reijnders, Eindhoven (NL); Hendrik Sabert, London (GB); Patrick Sebastian Uebel, Marloffstein (DE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/626,852

(22) PCT Filed: Jul. 7, 2020

(86) PCT No.: PCT/EP2020/069059
§ 371 (c)(1),
(2) Date: Jan. 13, 2022

(87) PCT Pub. No.: WO2021/008929
PCT Pub. Date: Jan. 21, 2021

(65) Prior Publication Data
US 2022/0291595 A1    Sep. 15, 2022

(30) Foreign Application Priority Data

Jul. 16, 2019 (EP) .................................. 19186446
Aug. 28, 2019 (EP) .................................. 19193972

(51) Int. Cl.
*G03F 7/20* (2006.01)
*G03F 7/00* (2006.01)

(52) U.S. Cl.
CPC .............................. *G03F 7/70616* (2013.01)

(58) Field of Classification Search
CPC ............. G03F 7/70616; G03F 7/70141; G03F 7/70025; G03F 7/70191; G03F 7/70575;
(Continued)

(56) References Cited

U.S. PATENT DOCUMENTS 6,961,116 B2    11/2005    Den Boef et al.
2002/0071173 A1*    6/2002    Lee ...................... H01S 3/1301
                                                            359/337.1
(Continued)

FOREIGN PATENT DOCUMENTS

EP    1 628 164 A2    2/2006

OTHER PUBLICATIONS

International Search Report and Written Opinion of the International Searching Authority directed to related International Patent Application No. PCT/EP2020/069059, dated Oct. 9, 2020; 12 pages.

*Primary Examiner* — Mesfin T Asfaw
(74) *Attorney, Agent, or Firm* — Sterne, Kessler, Goldstein & Fox P.L.L.C.

(57) ABSTRACT

Provided are light sources and methods of controlling them, and devices and methods for use in measurement applications, particularly in metrology, for example in a lithographic apparatus. The methods and devices provide mechanisms for detection and/or correction of variations in the light source, in particular stochastic variations. Feedback or feedforward approaches can be used for the correction of the source and/or the metrology outputs. An exemplary method of controlling the spectral output of a light source which emits a time-varying spectrum of light includes the steps of: determining at least one characteristic of the spectrum of light emitted from the light source; and using said determined characteristic to control the spectral output.

10 Claims, 11 Drawing Sheets

(58) Field of Classification Search
CPC ............ G03F 7/70625; G03F 7/70633; G01N 21/956; H01S 3/0078; H01S 3/0092
See application file for complete search history.

(56) References Cited

U.S. PATENT DOCUMENTS

| | | |
|---|---|---|
| 2003/0234854 A1 | 12/2003 | Hattori |
| 2007/0146700 A1* | 6/2007 | Kowarz ................ G01J 3/02 356/310 |
| 2009/0195768 A1 | 8/2009 | Bijnen et al. |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2011/0299073 A1* | 12/2011 | Sakurai ................ G01J 3/51 356/319 |
| 2012/0044470 A1 | 2/2012 | Smilde et al. |
| 2014/0104614 A1* | 4/2014 | Rokitski ................ G01J 3/28 356/402 |
| 2015/0261097 A1 | 9/2015 | Mathijssen et al. |
| 2016/0161863 A1 | 6/2016 | Den Boef et al. |
| 2016/0370717 A1 | 12/2016 | Den Boef et al. |
| 2017/0184981 A1 | 6/2017 | Quintanilha et al. |
| 2018/0348145 A1 | 12/2018 | Witte et al. |
| 2019/0079410 A1 | 3/2019 | Geypen |
| 2019/0155170 A1 | 5/2019 | Aggarwal |

* cited by examiner

LIGHT SOURCES AND METHODS OF CONTROLLING; DEVICES AND METHODS FOR USE IN MEASUREMENT APPLICATIONS

CROSS REFERENCE TO RELATED APPLICATIONS

This application claims priority of EP application 19186446.1 which was filed on 2019 Jul. 16 and EP application 19193972.7 which was filed on 2019 Aug. 28 and whom are incorporated herein in their entirety by reference.

FIELD

The present invention relates to light sources and methods of controlling them, and to devices and methods for use in measurement applications, particularly in metrology, for example in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A metrology apparatus can be used to measure parameters of interest of structures on the substrate. For example, a metrology apparatus can be used to measure parameters such as critical dimension, overlay between layers on the substrate and asymmetry of a pattern on the substrate. Rays of measurement radiation are used to illuminate the substrate. The radiation is diffracted by the structure on the substrate. The diffracted radiation is collected by an objective lens and captured by a sensor.

The rays of measurement radiation are provided by light emitted by a light source. This light is directed onto the substrate via a beam splitter and the objective lens that collects the diffracted radiation from the substrate.

One possible light source for use in metrology applications is a supercontinuum light source, for example based on modulation instability or similar non-linear effects. This broadband source is then band-pass filtered to generate a narrowband source for use in the metrology process.

However, as the underlying physical mechanism is intrinsically stochastic in nature, such sources can generate intrinsic, non-avoidable spectral noise, which can degrade the performance of metrology sensors, especially when a short measurement time is desirable. In particular the spectrum and centroid wavelength of the filtered light will vary from shot to shot. Variations in wavelength of the light used for metrology can result in errors in the overlay. Similar problems with fluctuating output spectrums exist for other light sources.

SUMMARY

It is desirable, for example, to provide mechanisms for detection and/or correction of variations in the light source, in particular stochastic variations.

According to an aspect of the invention, there is provided a method of controlling the spectral output of a light source which emits a time-varying spectrum of light, the method including the steps of: determining at least one characteristic of the spectrum of light emitted from the light source; and using said determined characteristic to control the spectral output.

According to a further aspect of the invention, there is provided a method of performing measurements using a light source which emits a time-varying spectrum of light, the method including the steps of: determining at least one characteristic of the spectrum of light emitted from the light source; illuminating a measurement target with light from the light source and measuring light from the light source to generate measurement signals; and using said determined characteristic to process the measurement signals.

According to a further aspect of the invention, there is provided a light source which emits a time-varying spectrum of light, the light source including: a spectrometer arranged to measure a characteristic of the spectrum of light emitted from said light source; and a controller arranged to control the output of the light source based on the characteristic measured by the spectrometer.

According to a further aspect of the invention, there is provided a metrology apparatus, the apparatus including: a light source which emits a time-varying spectrum of light arranged to illuminate a metrology target; a spectrometer arranged to measure a characteristic of the spectrum of light emitted from said light source; a sensor arranged to measure light from the metrology target and generate metrology signals therefrom; and a controller arranged to control the output of the light source and to process signals from the sensor, wherein the controller is further arranged to either control the output of the light source or to process the metrology signals based on the characteristic measured by the spectrometer.

According to a further aspect of the invention, there is a provided a lithographic apparatus including a light source according to the above aspect or a metrology apparatus according to the above aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
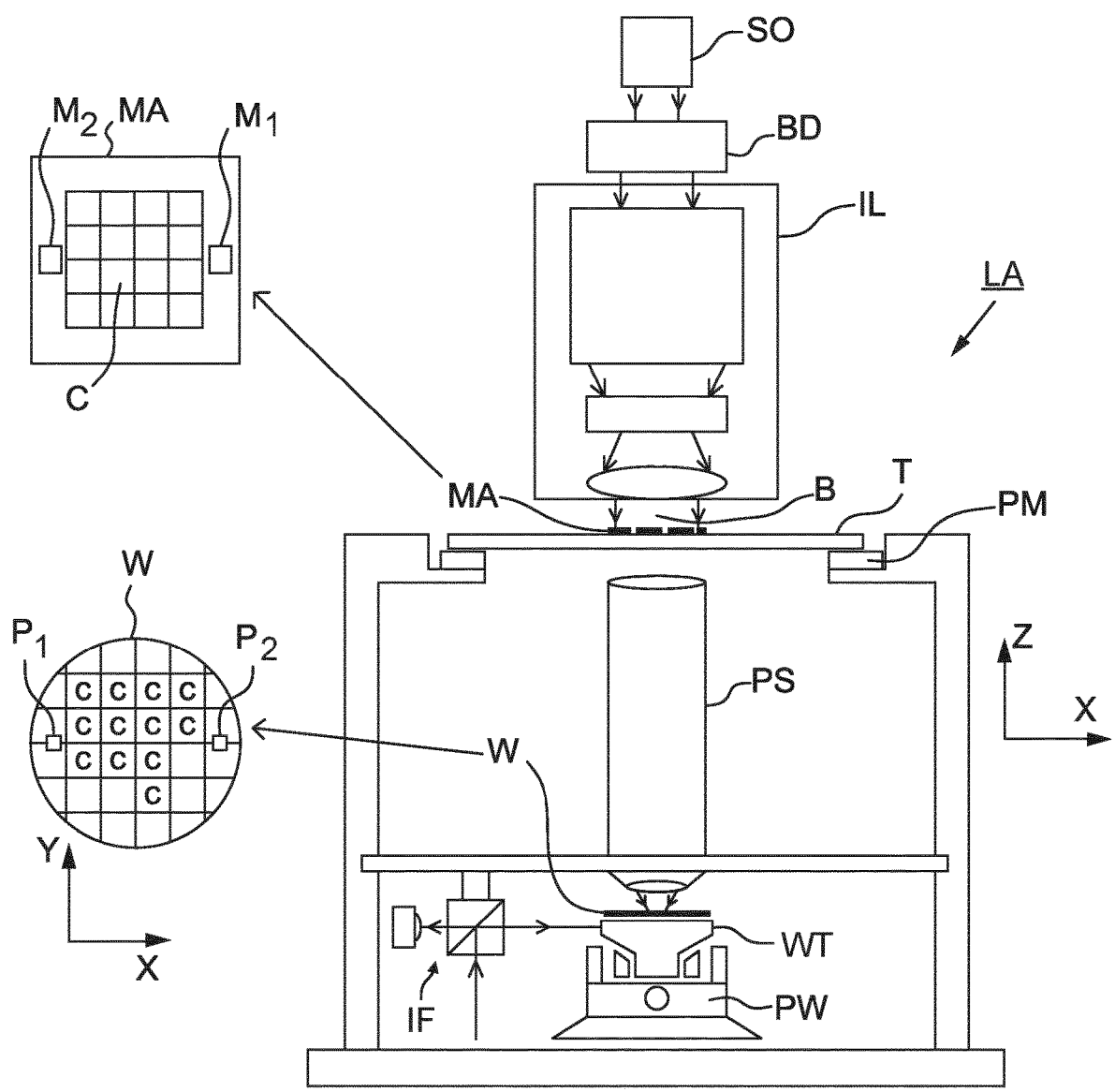
FIG. 1 depicts a schematic overview of lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
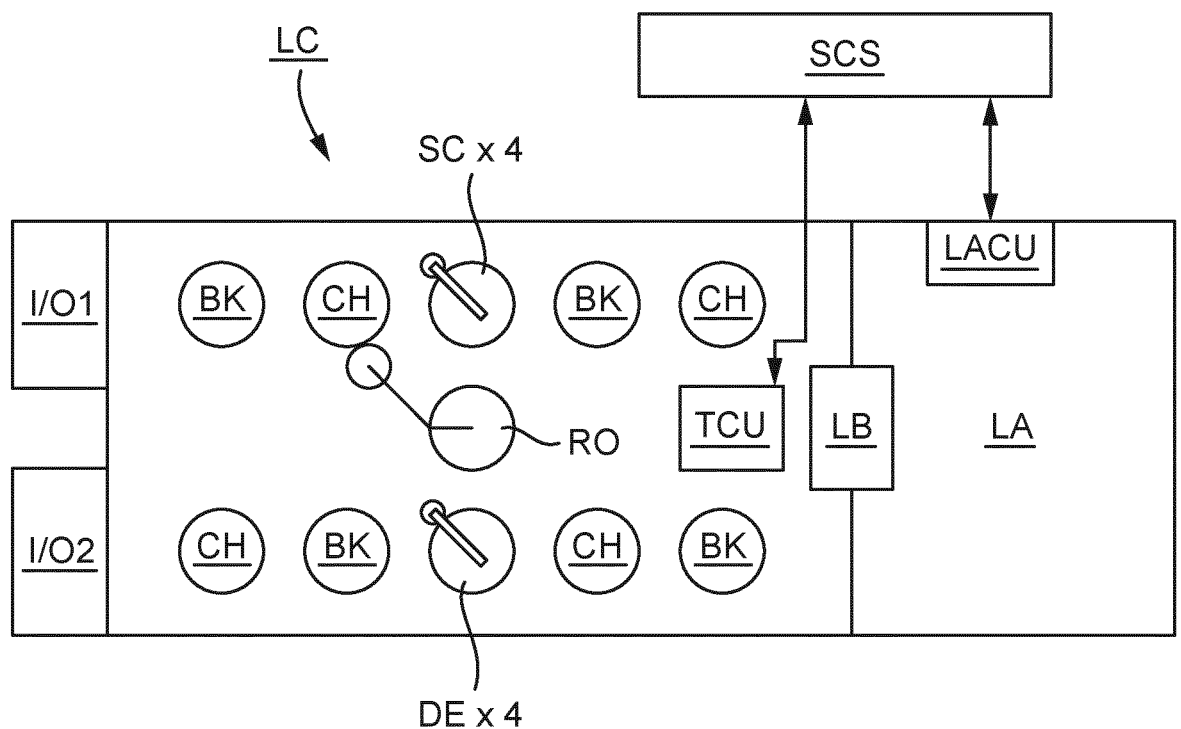
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
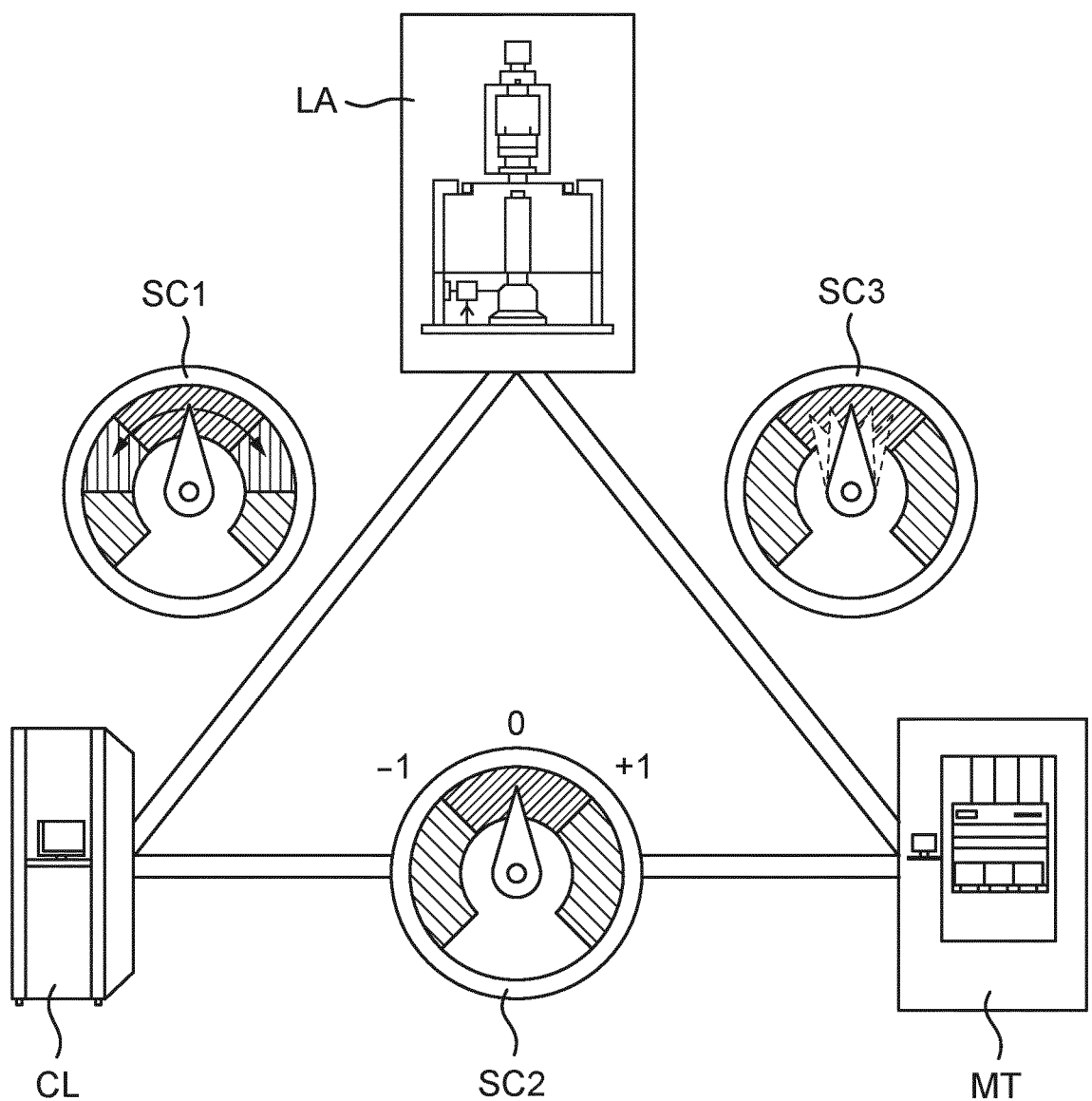
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Different types of metrology apparatus MT for making such measurements are known, including scanning electron microscopes or various forms of scatterometer metrology apparatus MT.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from the light source of the present invention.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety. The light source of the present invention may be configured to be controllable in respect to the light source requirements of these substrate measurement recipes.

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 4A:
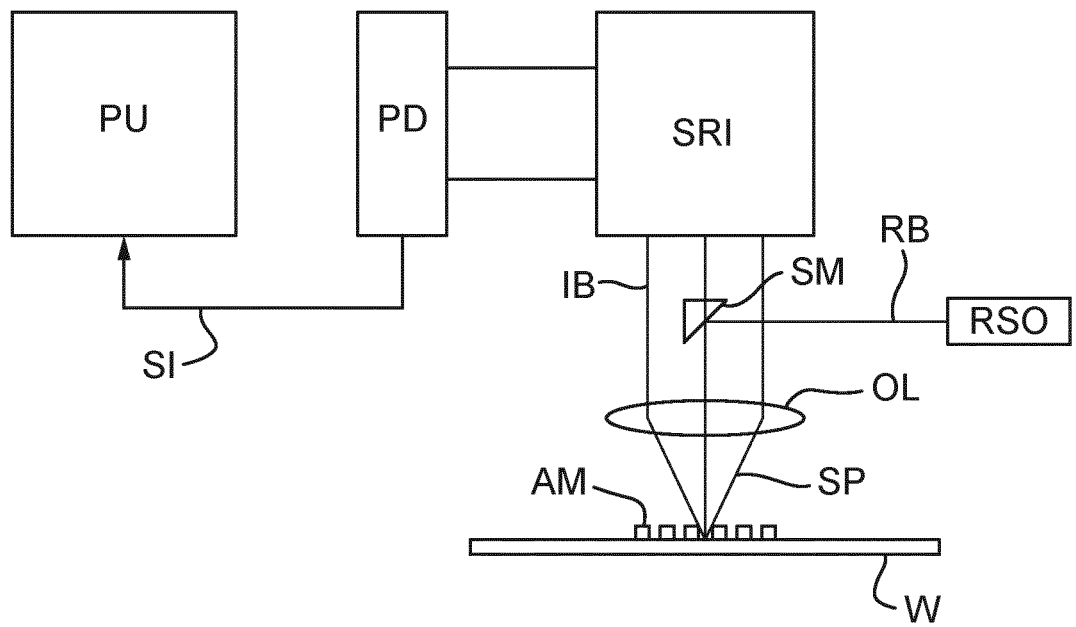
FIGS. 4A and 4B depict a schematic block diagram of an alignment sensor, and a level sensor respectively.

FIG. 4A is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The radiation source RSO may be provided by the light source of the present invention. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 4B:
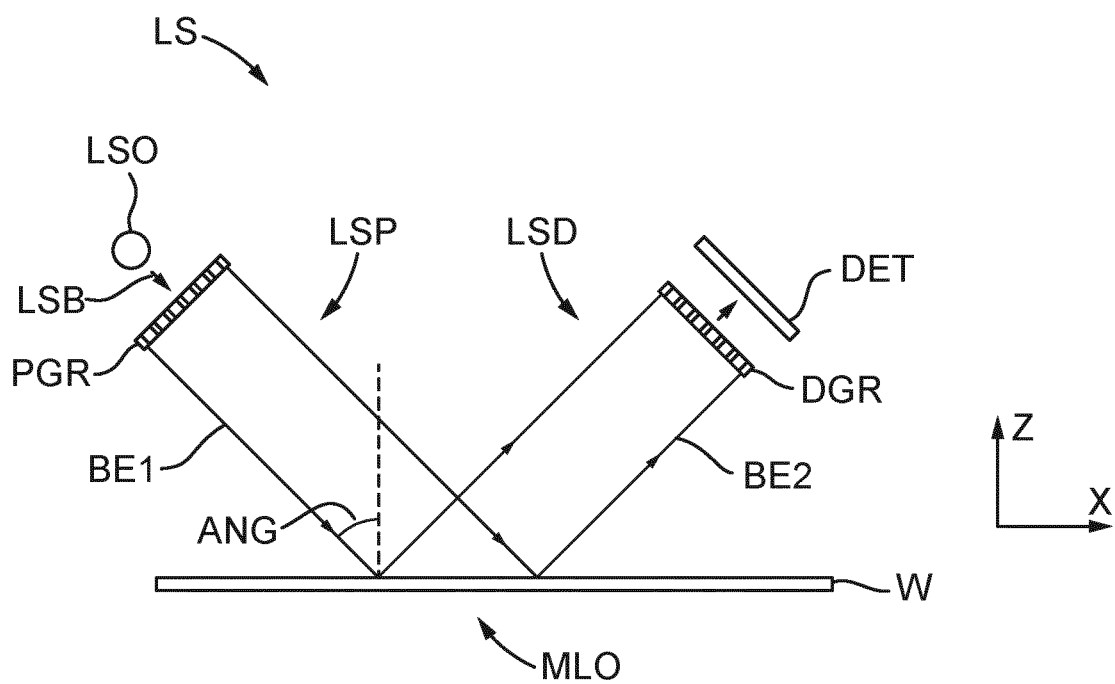

An example of a level or height sensor LS as known in the art is schematically shown in FIG. 4B, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP.

One example of the light source LSO is a broadband white light laser used together with an acoustic optical tunable filter (AOTF) to select wavelength bands. In these sources the pulsed output of a near-infrared laser is converted via a combination of non-linear effects into a broad super-continuum (SC), either using a gas in the core of the fibre as the non-linear medium, or the glass of a solid core fibre.

In one version of this system, super-continuum generation is carried out by a process called Modulation Instability (MI). This is essentially noise seeded, so the output spectrum of each pulse is different and uncorrelated. For a sensor application, the very broadband (typically 100s of nm) output of the SC source is then passed through a ~10 nm width wavelength selection bandpass filter such as an AOTF before being used in the sensor.

Since the shape of the input spectrum varies from pulse to pulse and the spectrum is not necessarily symmetric relative to the filter centre wavelength, the centroid wavelength of the spectrum at the output of the selection filter varies stochastically. Variations from pulse to pulse can be large, but the ensemble average of the variations can be made smaller by averaging over a large number of pulses. Since spectra are statistically independent, the standard deviation of the average declines with the square root of the number of pulses averaged over.

Figure 5:
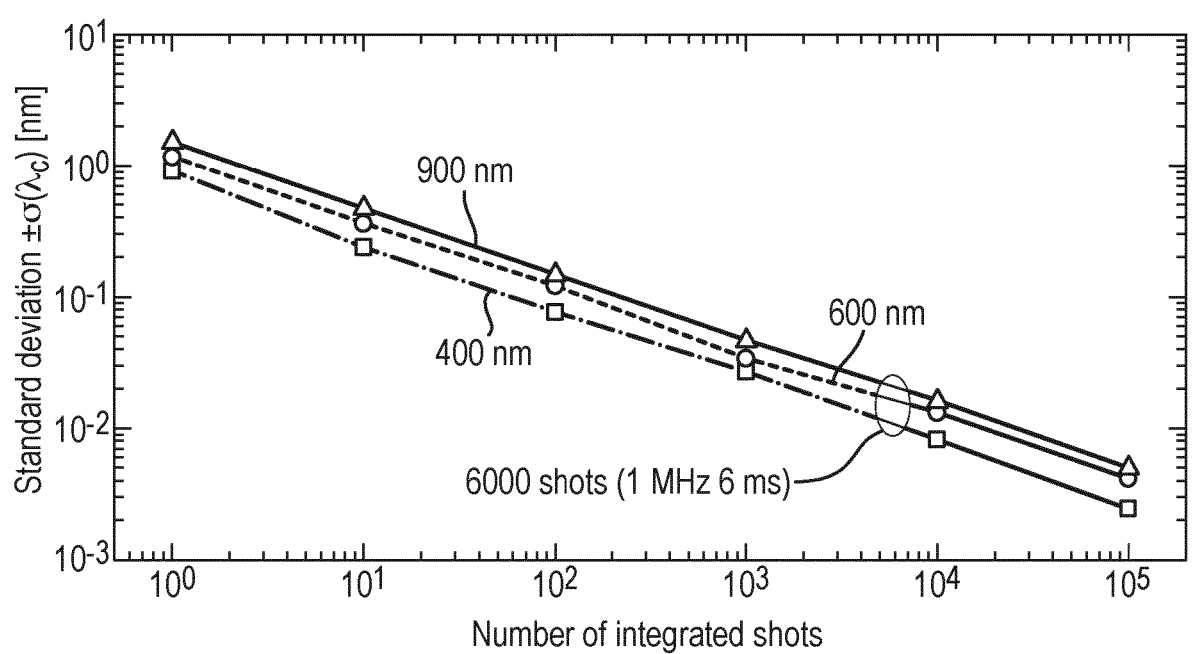
FIG. 5 shows the standard deviation of the ensemble averages of variation in central wavelength for a typical gas-filled supercontinuum light source as the number of pulses in each sample varies.

This is illustrated in FIG. 5 which shows the standard deviation of the ensemble averages of these variations for a typical gas-filled SC source as the number of pulses in each sample varies.

The example is for a 10 nm FWHM selection filter. In the example highlighted (6000 shots, 6 ms integration time) the standard deviation of the centroid wavelength of the output spectrum is small (~0.01 nm), but even this may be a performance limiting factor for the current and next generation of metrology sensors.

The simplest way to reduce spectral noise is to increase the size of the pulse sample over which the measurement averages. This can be done by either increasing the pulse repetition rate or increasing the measurement time. However, the latter is not desirable since it reduces system throughput and the former is problematic, since a minimum pulse energy is needed to enable the MI process (~10s of micro Joules in the case of gas-filled hollow core PCF.) Increasing the pulse repetition rate is therefore only possible by increasing average output power of the source, which is not desirable from a cost, size, complexity or thermal point of view.

In micro diffraction based overlay (μDBO), overlay information is stored in delta intensity between the illumination orders. Any intensity difference will be observed as overlay. The intensity is sensitive for small variations in wavelength, specific for more complex and/or thicker stacks. Preferably the delta wavelength is much less than 1 nm.

Figure 6:
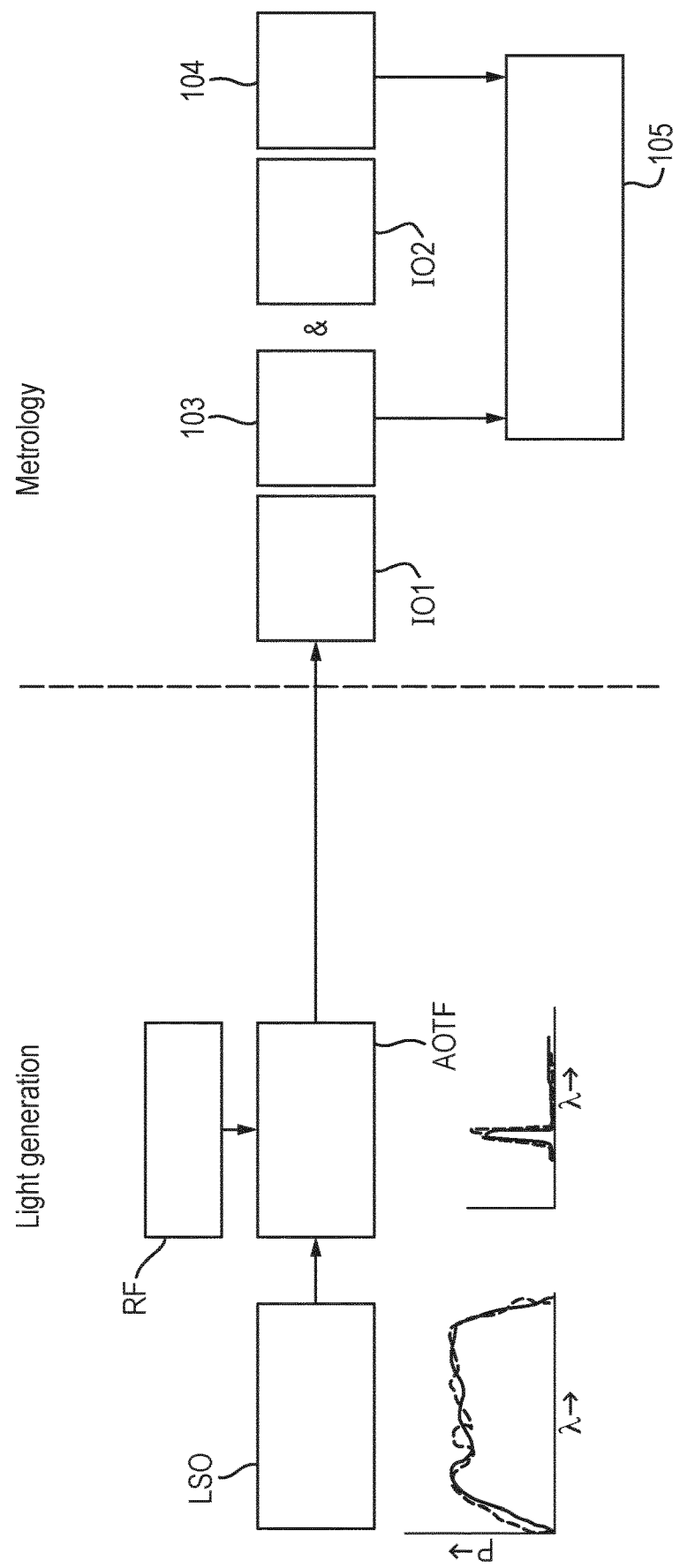
FIG. 6 is a schematic overview of a metrology application as used in a lithographic process.

In some existing metrology applications, an example of which is shown in outline in FIG. 6, two complementary illumination directions are imaged in sequence. The broadband light source LSO is band-pass filtered by a filter AOTF which is controlled by a radio-frequency generator RF, thus providing band selection of the output of the light source LSO. The filtered narrowband light source is then used for two separate illumination orders IO1, IO2 from which metrology images are taken through image acquisition steps 103, 104. Any delta wavelength 105 between the orders IO1 and IO2 results in a metrology error.

However, the stochastic behavior of the source will result in a different spectral shape for every shot. Local tilt variations of the spectrum will result, after bandpass filtering with the AOTF, in an effective shift of the central wavelength. This will result in overlay error.

Further, the two illumination branches IO1, IO2 of a system such as that shown in FIG. 6 may consist of separate hardware. Small variation of optical surfaces, optical alignment, coatings, fibers etc. can result in a difference in the spectral transmission between the two complementary branches. The first order effect is a wavelength-dependent mismatch that can be corrected by a power monitoring circuit and/or calibration. However, as indicated above, the central wavelength can also shift, resulting in a stack-dependent overlay error that is harder to fully correct for.

Similar problems can exist in metrology systems in which orders are acquired at the same time (and therefore from the same incident radiation from the light source) as a result of shifts in the absolute wavelength over time. For example, imperfections in the sensor and/or the target may result in absolute wavelength sensitivities such that the relationship between orders acquired at the same time is not consistent for each pair of measurements. The techniques presented in the present description can also be used to improve the consistency of the average wavelength of the light source, or to compensate for such variations, which may provide advantages for such metrology applications.

As indicated above, variations or noise in the central wavelength can be dealt with by integrating over a sufficiently large number of pulses (or a sufficiently long illumination time). However, this can increase the measurement time unacceptably, reducing the throughput of the associated apparatus (e.g. a lithographic apparatus). Alternatively, the pulse repetition rate can be increased to achieve the large number of pulses in the same time, but this requires greater energy input which, aside from increased power requirements and costs, can have its own undesirable effects in the heat load on both the target and the apparatus as a whole.

Although the present description is set out in relation to pulsed light sources, the same principles may apply to metrology using a continuous light source, in particular where it is possible to define and/or measure the output of the source over time intervals which are shorter than the total exposure time for a measurement.

Embodiments of the present invention present alternative approaches to dealing with and/or correcting for variations or noise in the pulses.

In one embodiment the fluctuations in the central wavelength of the source are accepted but measured carefully, either pulse-per-pulse or on average over the integration time for one measurement, and this error signal is then used to compensate for errors in the final sensor output. As the central wavelength fluctuations are small, it is likely to be possible to linearize their impact on the sensor output. The impact and therefore the correction factor will be target, wavelength, polarization and/or wafer dependent.

Figure 7:
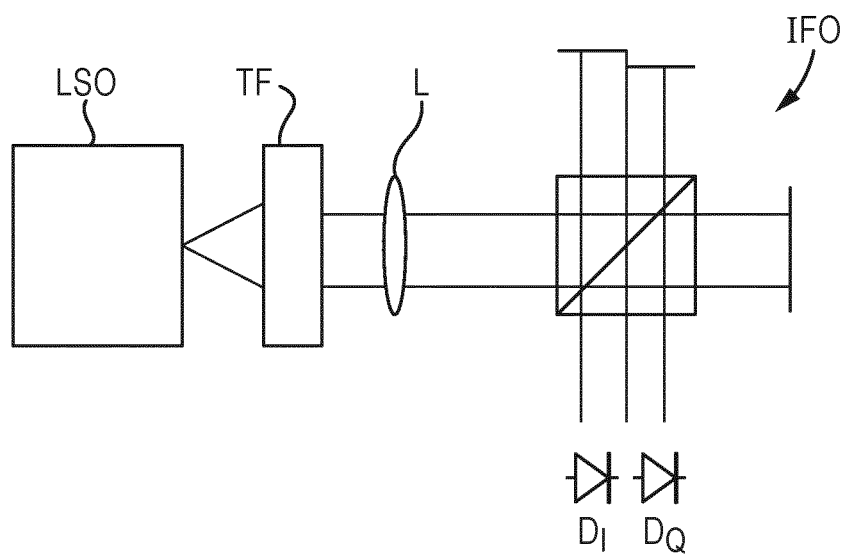
FIG. 7 shows an interferometer which may be used in embodiments of the present invention.
Figure 8:
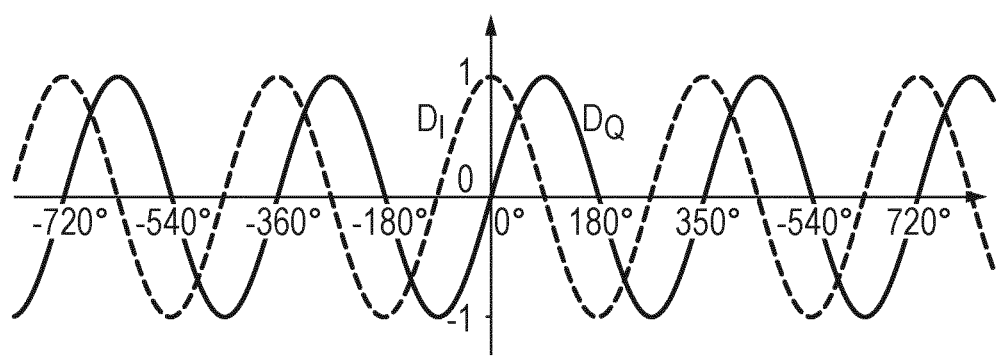
FIG. 8 shows the output of the interferometer of FIG. 7.

Various arrangements to generate a suitable error signal (a signal that is proportional to the instantaneous wavelength at the output of the source) are possible. One such arrangement is to use a suitably designed interferometer IFO, for example as shown in FIG. 7 to which the output from the light source LSO, is passed through a tunable filter TF and a lens L. Ideally the interferometer provides a quadrature output $D_Q$ proportional to the instantaneous wavelength of the filtered source, as shown in FIG. 8, in which the x axis is the instantaneous source center wavelength. The quadrature output $D_Q$ has a free spectral range in the same order of magnitude as the filter bandwidth. This could for example take the shape of a two-channel Michelson interferometer with an average pathlength difference of ~0.5-1% to achieve a suitable free spectral range, and the two channels being detuned in pathlength difference to provide a quadrature output. In other embodiments the free spectral range of the output may be larger (even significantly larger) than the filter bandwidth. The selection of the free spectral range is a trade-off with the desired signal-to-noise ratio.

An alternative arrangement may consist of Fabry-Perot interferometers with wedge or step shaped cavities to produce quadrature output or even gratings or a combinations of narrow band interference filters. Suitable quadrature signals can also be derived via polarisation optics. Further alternative arrangements may use thin film coatings with periodic transmission or planar parallel plates which are coated/uncoated.

It is important to note that the absolute long-term stability of the sensor interferometer is not critical. The operating wavelength of the system over the longer term is determined by the centre wavelength of the highly precise and stable wavelength selection bandpass filter already present in the system. The role of the additional feedback sensor provided here is simply to provide a short-term error signal indicating how much the instantaneous (e.g. per shot) central wavelength at the output of the filter differs from the filter's centre wavelength. Over the longer term (seconds and beyond) it can be assumed that this error is zero, significantly simplifying the construction of the error sensor.

In a further embodiment of the present invention, the AOTF's can be used during the acquisition of a camera image to stabilize the wavelength, by specifically targeting them to get the mean wavelength stable during the exact image acquisition interval used.

Additionally, the error can be further minimized at the tradeoff of dose variation (which can be easily compensated). This can be done by turning off the light (or stopping the image acquisition), at a moment in time the error is by chance due to stochastic fluctuations at a low error value. These arrangements are illustrated in the simulation results described in more detail below.

If needed, the wavelength setpoint of the second complementary image acquisition can set to the measured setpoint during the first complementary image acquisition.

In further embodiments, the AOTFs can be used to change the mean wavelength setpoint between the complementary image acquisitions. The (systematic) delta between central wavelengths can be calibrated. This calibration can then be used during measurements as a lookup table to change the setpoint of the AOTFs for each illumination branch. The difference in transmission is then compensated by the (slight) change in the incoming wavelength.

The delta in wavelength behavior can be directly measured and calibrated with a spectrometer at wafer level, or by using indirect measurements like overlay delta (with wafer rotation).

Figure 9:
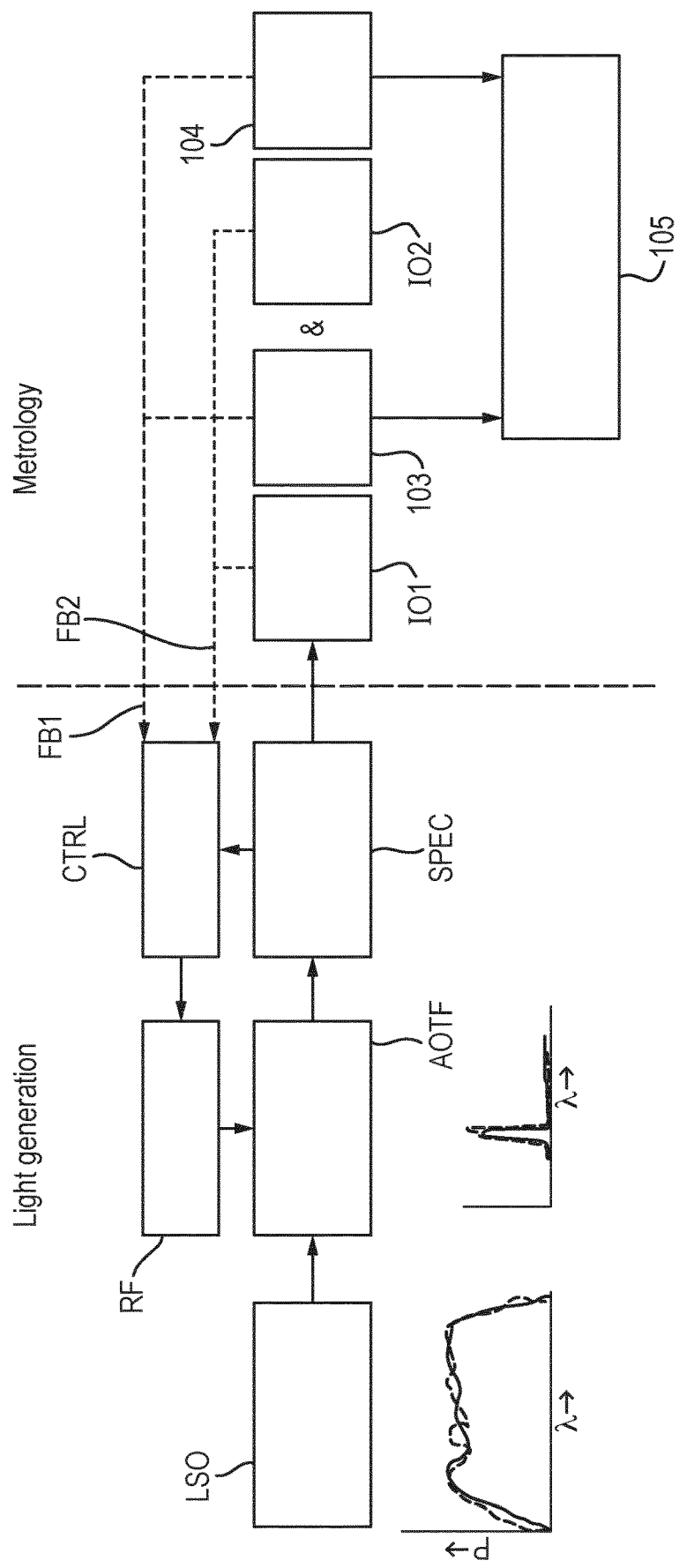
FIG. 9 is a schematic overview of a metrology application according to an embodiment of the present invention.

These embodiments are shown schematically in FIG. 9, which adopts the general layout of the system of FIG. 6 with additional components added. The components which are common to FIG. 6 will not be described further. In the apparatus shown in FIG. 9, a spectrometer SPEC is arranged to perform inline spectrum measurement and in particular to measure the variation in the output of the filter AOTF prior to the light being used in the metrology applications IO1, IO2. The spectrometer measurements are fed back to a controller CTRL which also takes inputs FB1, FB2 from the metrology applications as well. Feedback FB1 from the image acquisition steps 103, 104 is used in synchronization of the acquisition window, while feedback FB2 from the illumination orders IO1, IO2 is used. to determine a calibrated delta in the spectral transmission between the two orders so that the difference in central wavelengths 105 between the measurement orders is significantly reduced by the feedback control.

The AOTF can be used to high frequency tune the wavelength selection by changing its RF frequency. In order to do this, it is preferable that the control bandwidth of the AOTF is significantly larger than the reciprocal of the image acquisition time (which may be eg 1-10 ms). For example, an control bandwidth of 100 kHz (100 time periods within image acquisition time) is realistic.

For high-speed feedback, inline spectral measurements are needed at the same bandwidth as the control loop, for example 100 kHz. This is reasonable for a fast spectrometer. More specialized spectrometers, which are optimized for measuring small spectral variations (instead of the full absolute spectrum) may also be used, and may be specifically designed for these purposes, such as those already described above.

The control system is synchronized to the camera acquisition. The control system calculates the exact average (or integrated) central wavelength starting from the beginning of the exposure. This is used to change the setpoint of the AOTF. The gain of the control loop increases linearly over time with the number of pulses (to compensate for the fact that the total is divided by N in the averaging).

Additionally, a further significant improvement can be obtained by allowing a variation in the number of pulses (or dose). As the mean wavelength is itself stochastic (as a result of the stochastic input), if the exposure is stopped exactly at the moment the mean central wavelength randomly reaches a low number, the wavelength error will be reduced.

Whilst the above arrangement is used to stabilize the central wavelength, second order parameters of the wavelength band (e.g. FWHM of band, tilt) can also be corrected if additional degrees of freedom are available in the AOTF to control those. For example, if multiple nearby RF frequencies are used to drive the AOTF with a larger bandwidth, the relative amplitudes with respect to frequency can be controlled to also stabilize those average properties in the acquisition window.

In a further development, if multiple sensors are arranged to share the same source (e.g. a single broadband light source with multiple individual AOTFs feeding to the sensors), a single inline spectrometer could be used that measures the spectrum before it enters the AOTFs. If the AOTF behavior is well known and/or calibrated, the controller can then be used to retrieve the central wavelength after the AOTFs.

A similar control strategy can be applied to correct the illumination dose by changing the RF power. For many existing metrology applications this may not add significant benefit, because the power can be normalized afterwards. However, for other sensors/sensor arrangements this may be different.

The above arrangements can be applied in system which do not use AOTFs, the same scheme would be possible by using alternative fast actuators that can (slightly) change the wavelength. For example using some optics with a coating that creates a tilt over the spectrum and has some angular or position dependence. By mechanical fast tilting/moving such a filter the central wavelength can be influenced. Similarly a filter may be used which spatially separates the wavelengths and filters the light, for example using movable blades. These blades high-frequency modulation could then be applied to such blades to make small adjustments to the filter operation.

The exact stochastic behavior of the wavelength of a super-continuum light source will depend on many parameters like wavelength and bandwidth. Larger bandwidth, which will be favorable for throughput, will suffer most from spectral tilt variations. Therefore, in order to illustrate the use of the above embodiments, a number of simulations have been conducted to show the simple scaling rules of the error.

Figure 10:
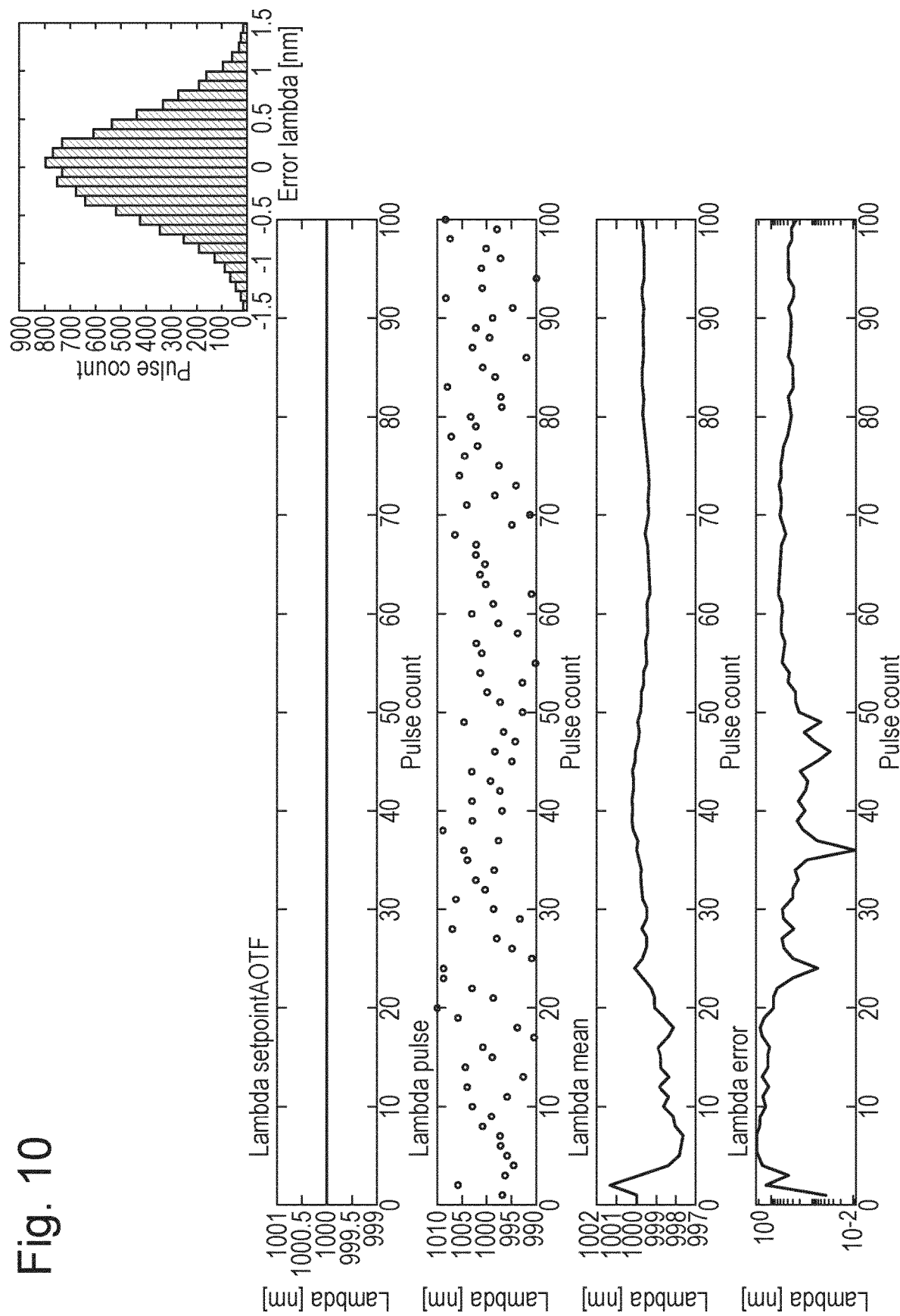
FIG. 10 shows the results of a simulation of the output of a light source without feedback.
Figure 11:
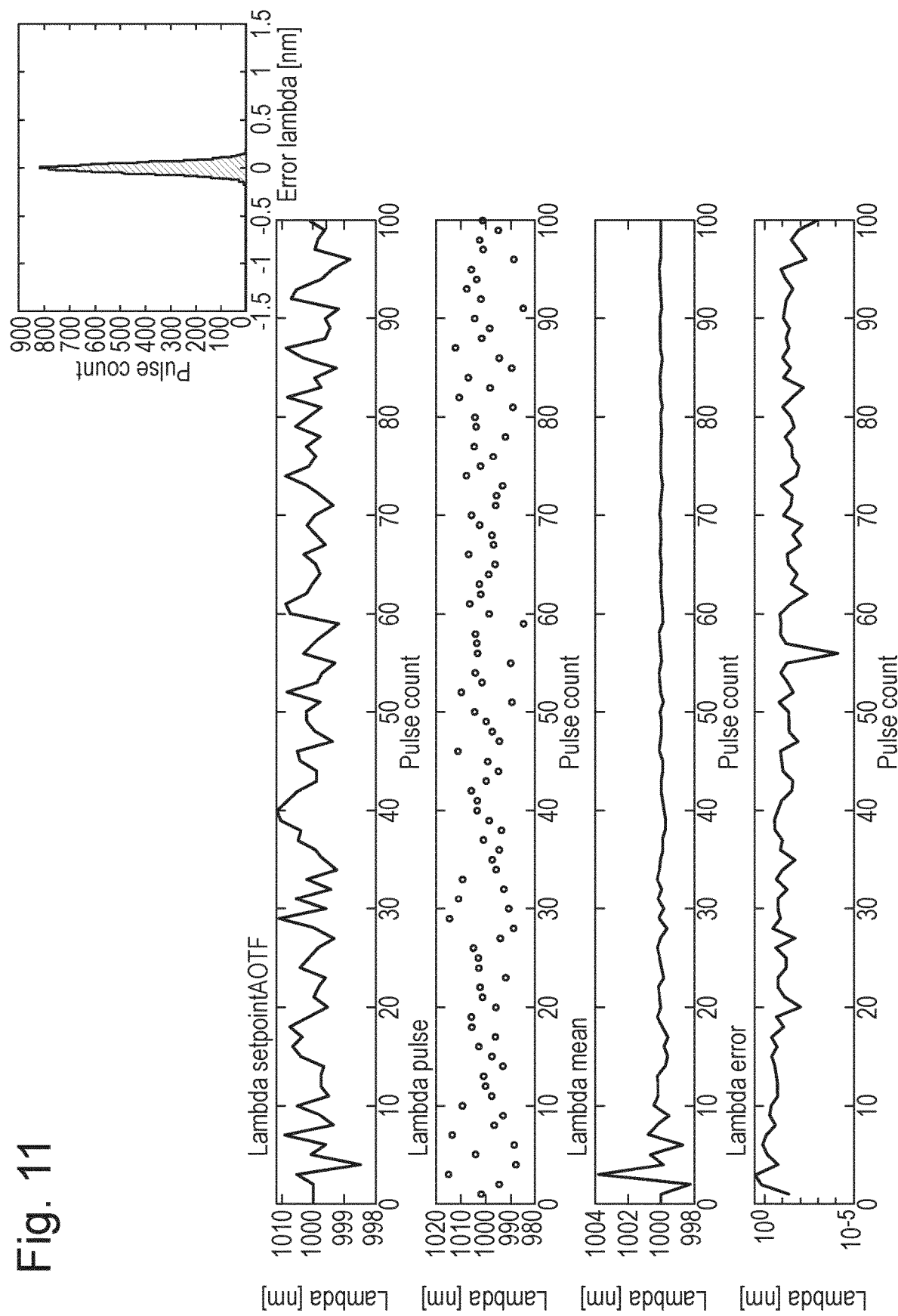
FIG. 11 shows the results of a simulation of the output of a light source according to an embodiment of the present invention.
Figure 12:
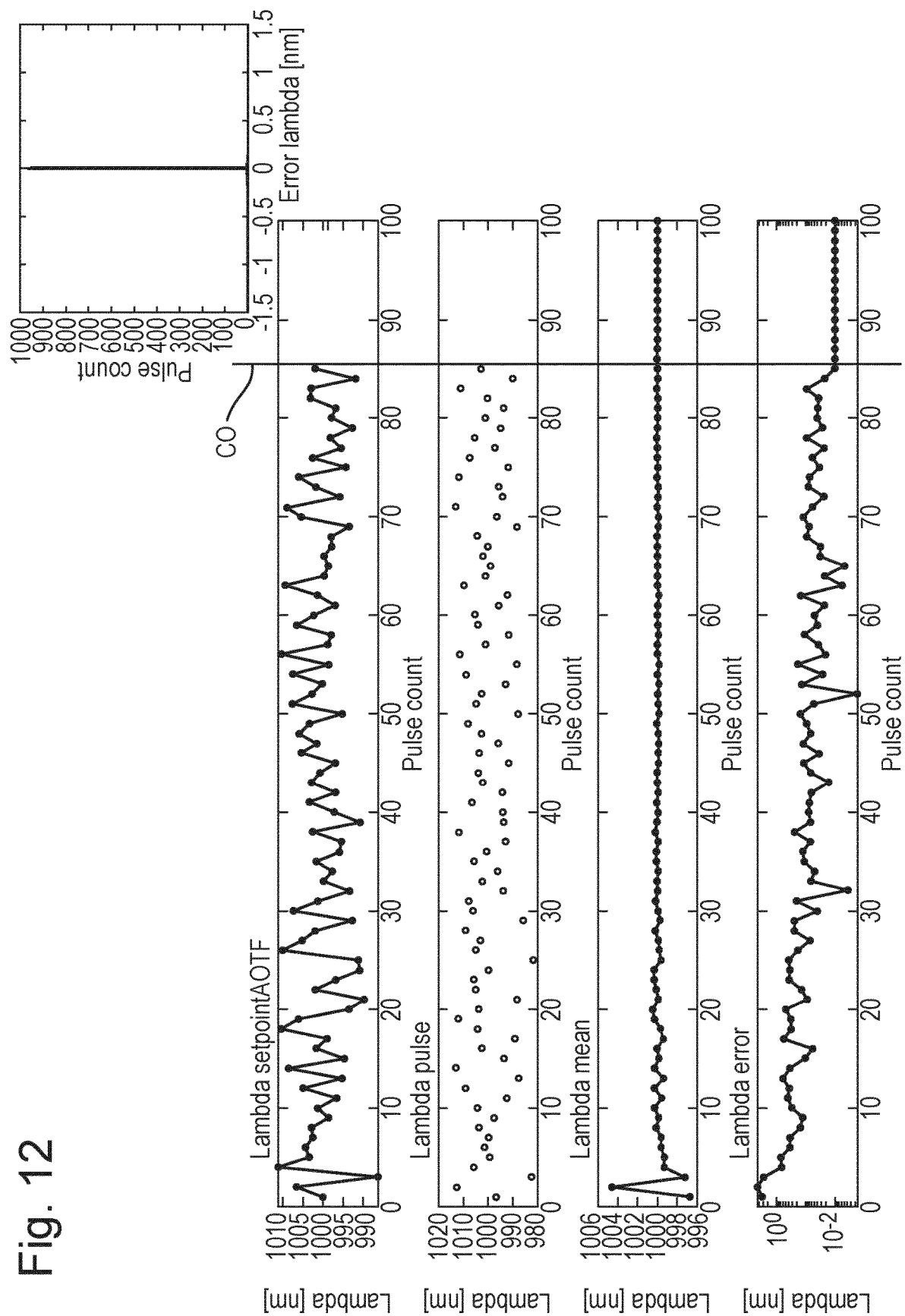
FIG. 12 shows the results of a simulation of the output of a light source according to a further embodiment of the present invention.

The results of these simulations are shown in FIGS. 10-12. In the plots the setpoint, central wavelength of a single pulse, mean central wavelength and the central wavelength error are plotted above each other on the same time axis. The inset histogram shows the error distribution for a high number of unique runs in the simulation.

For these simulations it is assumed that there is a Normal-distributed 5 nm 1-sigma central wavelength variation per pulse in selected band of the source, and that 100 pulses are used in a single image acquisition. Note that, in practical terms, the pulses can be individual laser pulses, but could also be sets of laser pulses together in case control loop frequency<laser frequency, which would be most likely in a practical implementation. Similarly, instead of a plurality of pulses, the light source may continuously illuminate the target over a predetermined time window, with discrete measurements being taken of the wavelength characteristics of the light at a plurality of instances within that window. References to numbers of pulses in the following would, in such arrangements, be replaced by reference to the number of discrete measurements.

For simplicity, uncertainty and/or noise in the AOTF itself and in the spectral measurement are neglected.

With no feedback (FIG. 10), in other words with a constant AOTF setpoint as shown in the upper plot, it can be seen that the error of a single laser pulse is reduced with sqrt(N), i.e. $\sigma$=5 nm/sqrt(100)=0.5 nm error after 100 pulses.

With feedback to stablise the mean central wavelength (FIG. 11), and a variable setpoint AOTF varying as shown in the upper plot, the error reduces with factor N (instead of sqrt(N)). Only the error of the last pulse counts, and affects the average by 1/N, reducing the error: $\sigma$=5 nm/100=0.05 nm error after 100 pulses (and thus a 10 times improvement on the situation without feedback).

FIG. 12 illustrates the possibility of using "smart stopping", i.e. stopping the illumination at a moment in time when the error happens to be very small and selecting exactly that situation. Due to the stochastic behavior of the system, the error can sometimes, by chance, be very small. By selecting exactly that situation, the overall performance can be significantly improved.

In the simulation shown in FIG. 12, the number of pulses was allowed to vary between 80 and 100 pulses, thus guaranteeing a minimum dose of 80% of the "standard" dose. In the particular simulation shown, the simulation was arranged to stop if the wavelength error dropped to 0.01 nm or lower at any time within the allowed window, which happened at point CO after ~85 pulses.

The choice of parameters for the minimum number of pulses and the cut-off error level, below which the illumination will be stopped, will obviously affect both the accuracy achieved and the proportion of times that the illumination will be stopped in this manner. The choice of cut-off error level is a matter of choice which may be dependent on the relative contributions of other error sources and thus the point at which the wavelength error becomes insignificant. The choice of minimum number of pulses is a trade off between the power required to get good overlay information and the accuracy desired and so the choice may be dependent on the specific implementation or use of the metrology application.

The inset histogram in FIG. 12 is a histogram of the pulse count at which the simulation is stopped, which shows that, whilst in a number of simulations, the full 100 pulses will be delivered without the simulation being stopped, for a greater number of simulations, an early stop will be arrived at.

This results in a further reduction in the error (in the particular simulation shown in FIG. 12, by a factor of ~5N, but the exact amount will depend on the number of pulses that can be skipped and the parameters chosen for stopping the illumination).

In a further development of this arrangement, the cut-off error level may be variable over time/number of pulses to further improve the statistical stability of the source. For example, after the minimum number of pulses has been reached, the cut-off error level may increase progressively as the number of pulses to increase the chance that the system is stopped at a favourable low mean error state.

Thus the approaches outlined in the present embodiments can significantly reduce the amount of noise without needing very high repetition rates that may be difficult to accomplish.

Further embodiments are disclosed in the subsequent numbered clauses:

1. A method of controlling the spectral output of a light source which emits a time-varying spectrum of light, the method including the steps of:
   determining at least one characteristic of the spectrum of light emitted from the light source; and
   using said determined characteristic to control the spectral output.
2. The method according to claim 1, further including the step of conditioning the output of the light source, wherein the step of using the determined characteristic changes the conditioning of the output of the light source.
3. The method according to claim 2 wherein the step of conditioning the output of the light source includes band-filtering the output, and the step of using the determined characteristic adjusts the filtering.
4. The method according to claim 3 wherein the adjusting of the filtering is done dynamically to reduce the variation in the centre frequency of the light passing through.
5. The method according to any one of claims 2 to 4 further including the steps of:
   emitting light from the light source over a predetermined time window; and
   determining a running variation in the characteristic over the time window,
   wherein the step of using the determined characteristic uses the determined running variation.
6. The method according to claim 5 wherein the frequency characteristic is the variation in the centre frequency of the light passing through the band-pass filter from an expected centre frequency, and is determined for a plurality of subsidiary time windows falling within said time window, wherein the method further includes the steps of:
   prior to the end of the time window, checking if the determined variation is less than a cut-off value; and
   if the determined variation is less than the cut-off value, stopping the emission of light before the completion of the time window.
7. The method according to claim 6 wherein the steps of checking and stopping are only performed after either: a minimum time has elapsed; a predetermined minimum number of pulses have been emitted from the light source; or a predetermined amount of pulse energy has been emitted.
8. The method according to claim 6 or claim 7 wherein the cut-off value is dynamically varied for example based on the number of pulses that have already been emitted.
9. A method of performing measurements using a light source which emits a time-varying spectrum of light, the method including the steps of:
   determining at least one characteristic of the spectrum of light emitted from the light source;
   illuminating a measurement target with light from the light source and measuring light from the light source to generate measurement signals; and
   using said determined characteristic to process the measurement signals.
10. The method according to claim 9 wherein the at least one measurement is a metrology measurement.
11. The method according to any one of the preceding claims wherein the characteristic is an average wavelength of the light source within a predetermined wavelength range.
12. The method according to any one of the preceding claims wherein the light source is a supercontinuum light source.
13. The method according to claim 12 wherein the radiation generated by the supercontinuum light source includes radiation generated by modulation instability.
14. The method of any of the preceding claims, further comprising the step of using the generated light source in a metrological instrument.
15. The method of any of the preceding claims, further including the step of using the generated light source to perform metrology in a lithographic apparatus.
16. A light source which emits a time-varying spectrum of light, the light source including:
   a spectrometer arranged to measure a characteristic of the spectrum of light emitted from said light source; and
   a controller arranged to control the output of the light source based on the characteristic measured by the spectrometer.
17. The light source according to claim 16, further including a band-pass filter arranged to allow a predetermined range of frequencies of light to be emitted, wherein the controller is arranged to control the band-pass filter to adjust the light emitted dependent on the characteristic measured by the spectrometer.
18. The light source according to claim 17 wherein the light source is a supercontinuum light source and the band-pass filter includes an acoustic optical filter.
19. A metrology apparatus, the apparatus including:
   a light source which emits a time-varying spectrum of light arranged to illuminate a metrology target;
   a spectrometer arranged to measure a characteristic of the spectrum of light emitted from said light source;
   a sensor arranged to measure light from the metrology target and generate metrology signals therefrom; and
   a controller arranged to control the output of the light source and to process signals from the sensor,
   wherein the controller is further arranged to either control the output of the light source or to process the metrology signals based on the characteristic measured by the spectrometer.
20. The metrology apparatus according to claim 19, wherein the light source further includes a band-pass filter arranged to allow a predetermined range of frequencies of light to be emitted, and the controller is arranged to control the band-pass filter to adjust the light emitted dependent on the characteristic measured by the spectrometer.
21. The metrology apparatus according to claim 20 wherein the light source is a supercontinuum light source and the band-pass filter includes an acoustic optical filter.
22. The metrology apparatus according to any one of claims 19 to 21 further including a plurality of light paths from the light source to a plurality of metrology targets, wherein the spectrometer is arranged to measure the characteristic prior to division of the light from the light source into the plurality of light paths.

23. The metrology apparatus according to any one of claims 19 to 22 wherein the apparatus is arranged to illuminate the metrology target from at least two different directions and the controller is arranged to:
   control the light source so as to illuminate the metrology target from each of said different directions at different times;
   determine, from the measured characteristic at each of said different times, an expected variation in the signals from the sensor at each of said different times; and
   process the signals from the sensor at each of said different times to calibrate for the effects of the expected variation.

24. The metrology apparatus according to any one of claims 19 to 22 wherein the apparatus is arranged to illuminate the metrology target from at least two different directions and the controller is arranged to:
   control the light source so as to illuminate the metrology target from each of said different directions at different times;
   determine, from the measured characteristic at a first of said different times, the variation in the characteristic at said first time from an expected value; and
   control the output of the light source at a second of said times based on said determined variation, so as to reduce the error resulting from variations in the characteristic at each of said different times.

25. A lithographic apparatus including a light source according to any one of claims 16 to 18 or a metrology apparatus according to any one of claims 19 to 24.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

While specific embodiments of the invention have been described above, it will be appreciated that the invention may be practiced otherwise than as described.

The descriptions above are intended to be illustrative, not limiting. Thus it will be apparent to one skilled in the art that modifications may be made to the invention as described without departing from the scope of the claims set out below.

The invention claimed is:

1. A method of controlling a spectral output of a light source in a metrology or lithography system, comprising:
   emitting a time-varying spectrum of light from the light source over a predetermined time window;
   conditioning the emitted time-varying spectrum of light prior to interacting with a target;
   determining at least one characteristic of the time-varying spectrum of light emitted from the light source over the predetermined time window; and
   using the determined at least one characteristic to control the spectral output of the light source during the conditioning,
   wherein the conditioning the output of the light source further comprises band-filtering the output and the using the determined at least one characteristic adjusts the band-filtering, and
   wherein the adjusting of the band-filtering is done dynamically to reduce a variation in a center frequency of the time-varying spectrum of light.

2. The method of claim 1, further comprising:
   determining a running variation in the determine at least one characteristic over the predetermined time window,
   wherein the using the determined at least one characteristic comprises using the determined running variation.

3. The method of claim 2, wherein a frequency characteristic is the variation in the center frequency of the time-varying spectrum of light passing through a band-pass filter from an expected center frequency and is determined for a plurality of subsidiary time windows falling within the predetermined time window, wherein the method further comprises:
   prior to the end of the predetermined time window, checking if the determined running variation is less than a cut-off value; and
   if the determined running variation is less than the cut-off value, stopping the emission the time-varying spectrum of light before the completion of the predetermined time window.

4. The method of claim 3, wherein the cut-off value is dynamically varied based on a number of pulses that have already been emitted.

5. The method of claim 1, wherein the determined at least one characteristic is an average wavelength of the light source within a predetermined wavelength range.

6. The method of claim 1, wherein using the light source comprises using a supercontinuum light source, and wherein radiation generated by the supercontinuum light source includes radiation generated by modulation instability.

7. A light source configured to emit a time-varying spectrum of light in a metrology or lithography system, the light source comprising:
   a spectrometer configured to measure a characteristic of the time-varying spectrum of light emitted from the light source, wherein the time-varying spectrum of light is emitted from the light source over a predetermined time window and is conditioned prior to interacting with a target; and
   a controller configured to:
      determine at least one characteristic of the time-varying spectrum of light emitted from the light source over the predetermined time window, and
      use the determined at least one characteristic to control a spectral output of the light source during when the time-varying spectrum of light is conditioned,
      wherein when the time-varying spectrum of light is conditioned it is also band-filtered and adjusted, the band-filtering being based on the use of the determined at least one characteristic, and
      wherein the adjusting of the band-filtering is done dynamically to reduce variation in a center frequency of the time-varying spectrum of light.

8. A metrology apparatus, comprising:
a light source configured to emit a time-varying spectrum of light over a predetermined time window to illuminate a metrology target;
a spectrometer configured to measure a characteristic of the time-varying spectrum of light emitted from the light source over the predetermined time window;
a controller configured to use the measured characteristic to condition a spectral output of the light source prior to interacting with the metrology target and to process metrology signals, wherein:
when the spectral output is conditioned the spectral output is band-filtered and the band-filtering is adjusted using the measured characteristic,
the adjusting of the band-filtering is done dynamically to reduce a variation in a center frequency of the time-varying spectrum of light; and
a sensor configured to measure light received from the metrology target and generate the metrology signals therefrom,
wherein the controller is further configured to process the metrology signals based on the measured characteristic.

9. A lithographic apparatus comprising a light source configured to emit a time-varying spectrum of light, the light source comprising:
a spectrometer configured to measure a characteristic of the time-varying spectrum of light emitted from the light source, wherein the time-varying spectrum of light is emitted from the light source over a predetermined time window and is conditioned prior to interacting with a target on a substrate;
a controller configured to:
determine at least one characteristic of the time-varying spectrum of light emitted from the light source over the predetermined time window, and
use the determined at least one characteristic to control a spectral output of the light source during the conditioning,
wherein the conditioning the time-varying spectrum of light further comprises band-filtering the time-varying spectrum of light, and the band-filtering being adjusted using the determined at least one characteristic, and
wherein the adjusting of the band-filtering is done dynamically to reduce a variation in a center frequency of the time-varying spectrum of light;
a projection system; and
a detection system.

10. A lithographic apparatus comprising:
a light source configured to emit a time-varying spectrum of light over a predetermined time window to illuminate a metrology target;
a projection system;
a detection system; and
a metrology apparatus, comprising:
a spectrometer configured to measure a characteristic of the time-varying spectrum of light emitted from the light source over the predetermined time window;
a sensor configured to measure light received from the metrology target and generate metrology signals therefrom; and
a controller configured to:
use the measured characteristic to control the spectral output of the light source prior to interacting with the metrology target and to process the metrology signals,
process the metrology signals based on the measured characteristic,
wherein the processing of the metrology signals further comprises band-filtering the metrology signals, and the band-filtering is adjusted based the measured characteristic, and
wherein the adjusting of the band-filtering is done dynamically to reduce a variation in a center frequency of the time-varying spectrum light.

\* \* \* \* \*

UNITED STATES PATENT AND TRADEMARK OFFICE
CERTIFICATE OF CORRECTION

| | |
|---|---|
| PATENT NO. | : 11,971,663 B2 |
| APPLICATION NO. | : 17/626852 |
| DATED | : April 30, 2024 |
| INVENTOR(S) | : Reijnders et al. |

It is certified that error appears in the above-identified patent and that said Letters Patent is hereby corrected as shown below:

In the Claims

In Column 16, Claim 2, Line 16, delete "determine" and insert -- determined --, therefor.

In Column 18, Claim 10, Line 37, after "spectrum", insert -- of --.

Signed and Sealed this
Twelfth Day of November, 2024

Katherine Kelly Vidal
*Director of the United States Patent and Trademark Office*